United States Patent
Miyashita

(10) Patent No.: US 11,125,613 B2
(45) Date of Patent: Sep. 21, 2021

(54) EXTREME ULTRAVIOLET LIGHT SENSOR UNIT AND EXTREME ULTRAVIOLET LIGHT GENERATION APPARATUS

(71) Applicant: Gigaphoton Inc., Tochigi (JP)

(72) Inventor: Kotaro Miyashita, Oyama (JP)

(73) Assignee: Gigaphoton Inc., Tochigi (JP)

(*) Notice: Subject to any disclaimer, the term of this patent is extended or adjusted under 35 U.S.C. 154(b) by 91 days.

(21) Appl. No.: 16/673,548

(22) Filed: Nov. 4, 2019

(65) Prior Publication Data
US 2020/0064184 A1 Feb. 27, 2020

Related U.S. Application Data

(63) Continuation of application No. PCT/JP2017/021678, filed on Jun. 12, 2017.

(51) Int. Cl.
*G01J 1/42* (2006.01)
*G01J 1/04* (2006.01)
*H05G 2/00* (2006.01)

(52) U.S. Cl.
CPC .............. *G01J 1/429* (2013.01); *G01J 1/0488* (2013.01); *H05G 2/008* (2013.01)

(58) Field of Classification Search
CPC ........ G01J 1/429; G01J 1/0488; H05G 2/008; H05G 2/005; G03F 7/20
See application file for complete search history.

(56) References Cited

U.S. PATENT DOCUMENTS

2005/0045829 A1 3/2005 Ito et al.
2006/0072084 A1 4/2006 Van Herpen et al.

| | | | | |
|---|---|---|---|---|
| 2010/0108918 A1* | 5/2010 | Nagai | ..................... | H05G 2/005 250/504 R |
| 2010/0140512 A1* | 6/2010 | Suganuma | .......... | G03F 7/70033 250/504 R |
| 2011/0309271 A1* | 12/2011 | Moriya | ............... | G03F 7/70191 250/504 R |

(Continued)

FOREIGN PATENT DOCUMENTS

| JP | H11-061081 A | 3/1999 |
|---|---|---|
| JP | 2004-103773 A | 4/2004 |
| JP | 2005-069854 A | 3/2005 |

(Continued)

OTHER PUBLICATIONS

An Office Action; "Notification of Reasons for Refusal," mailed by the Japanese Patent Office dated Oct. 23, 2020, which corresponds to Japanese Patent Application No. 2019-524574 and is related to U.S. Appl. No. 16/673,548; with English language translation.

(Continued)

*Primary Examiner* — Kiho Kim

(74) *Attorney, Agent, or Firm* — Studebaker & Brackett PC

(57) ABSTRACT

An extreme ultraviolet light sensor unit according to one aspect of the present disclosure includes: a mirror configured to reflect extreme ultraviolet light; a wavelength filter configured to selectively transmit the extreme ultraviolet light reflected by the mirror; an optical sensor configured to detect the extreme ultraviolet light having transmitted through the wavelength filter; and a purge gas supply unit disposed to supply purge gas to a space between the wavelength filter and the optical sensor.

17 Claims, 9 Drawing Sheets

(56) References Cited

U.S. PATENT DOCUMENTS

2019/0107488 A1* 4/2019 Qiu ................... G01N 21/84

FOREIGN PATENT DOCUMENTS

| | | |
|---|---|---|
| JP | 2006-135307 A | 5/2006 |
| JP | 2007-109451 A | 4/2007 |
| JP | 2008-508722 A | 3/2008 |
| JP | 2010-147138 A | 7/2010 |
| JP | 2012-119099 A | 6/2012 |
| WO | 2006020080 A2 | 2/2006 |

OTHER PUBLICATIONS

International Search Report issued in PCT/JP2017/021678; dated Aug. 22, 2017.
International Preliminary Report On Patentability and Written Opinion issued in PCT/JP2017/021678; dated Dec. 17, 2019.

* cited by examiner

EXTREME ULTRAVIOLET LIGHT SENSOR UNIT AND EXTREME ULTRAVIOLET LIGHT GENERATION APPARATUS

CROSS-REFERENCE TO RELATED APPLICATIONS

The present application is a continuation application of International Application No. PCT/JP2017/021678 filed on Jun. 12, 2017. The content of the application is incorporated herein by reference in its entirety.

BACKGROUND

1. Technical Field

The present disclosure relates to an extreme ultraviolet light sensor unit and an extreme ultraviolet light generation apparatus.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation device configured to generate extreme ultraviolet (EUV) light at a wavelength of 13 nm approximately in combination with reduced projection reflective optics.

Disclosed EUV light generation devices include the three kinds of devices of a laser produced plasma (LPP) device that uses plasma generated by irradiating a target material with a pulse laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: National Publication of International Patent Application No. 2008-508722
Patent Document 2: Japanese Unexamined Patent Application Publication No. 2006-135307
Patent Document 3: Japanese Unexamined Patent Application Publication No. 2004-103773

SUMMARY

An extreme ultraviolet light sensor unit according to one aspect of the present disclosure includes: a mirror configured to reflect extreme ultraviolet light; a wavelength filter configured to selectively transmit the extreme ultraviolet light reflected by the mirror; an optical sensor configured to detect the extreme ultraviolet light having transmitted through the wavelength filter; and a purge gas supply unit disposed to supply purge gas to a space between the wavelength filter and the optical sensor.

BRIEF DESCRIPTION OF THE DRAWINGS

Embodiments of the present disclosure will be described below as examples with reference to the accompanying drawings.

DESCRIPTION OF EMBODIMENTS

Contents
1. Terms
2. Overall description of extreme ultraviolet light generation system
   2.1 Configuration
   2.2 Operation
3. Problem
4. Embodiment 1
   4.1 Configuration
   4.2 Operation
   4.3 Effect
5. Embodiment 2
   5.1 Configuration
   5.2 Operation
   5.3 Effect
6. Embodiment 3
   6.1 Configuration
   6.2 Operation
   6.3 Effect
7. Embodiment 4
   7.1 Configuration
   7.2 Operation
   7.3 Effect
8. Modification Embodiments of the present disclosure will be described below in detail with reference to the accompanying drawings.

The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Terms

"Target" is an object irradiated with a laser beam introduced into the chamber. When irradiated with the laser beam, the target generates plasma and radiates EUV light. The target is the plasma generation source. A droplet formed from a liquid target substance is a form of the target.

"Pulse laser beam" is a laser beam including a plurality of pulses.

"Laser beam" is not limited to a pulse laser beam but may be a general laser beam.

"Laser beam path" is the optical path of a laser beam.

"Plasma light" is radiation light radiated from the target as plasma. This radiation light includes EUV light.

"EUV light" stands for "extreme ultraviolet light".

"Optical component" is synonymous with an optical element or an optical member.

2. Overall Description of Extreme Ultraviolet Light Generation System

2.1 Configuration

Figure 1:
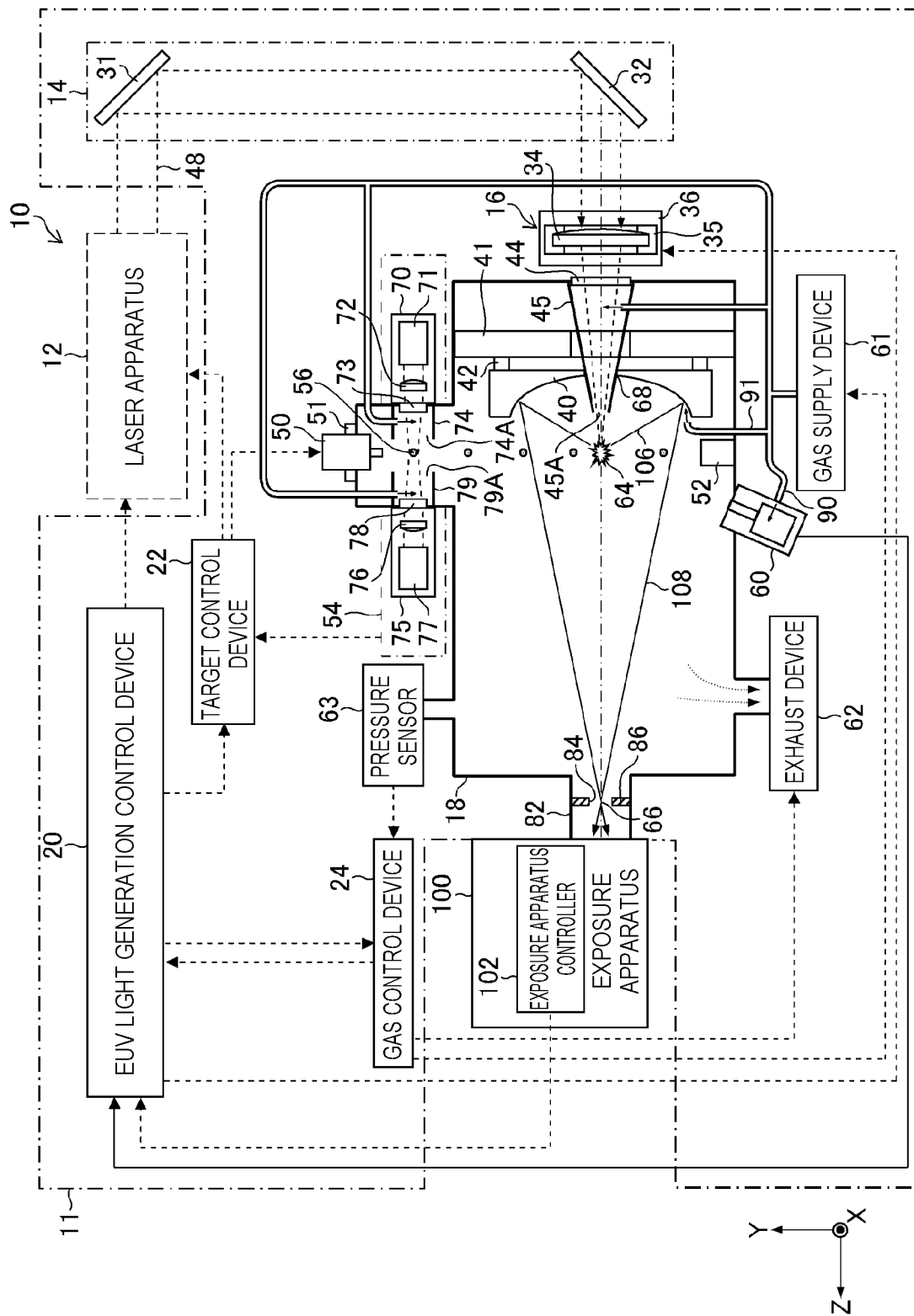
FIG. 1 is a diagram schematically illustrating the configuration of an exemplary LPP EUV light generation system.

FIG. 1 schematically illustrates the configuration of an exemplary LPP EUV light generation system 10. An EUV light generation apparatus 11 is used together with at least one laser apparatus 12 in some cases. In the present disclosure, a system including the EUV light generation apparatus 11 and the laser apparatus 12 is referred to as the EUV light generation system 10.

As illustrated in FIG. 1 and described below in detail, the EUV light generation apparatus 11 includes a laser beam transmission device 14, a laser beam condensation optical system 16, a chamber 18, an EUV light generation control device 20, a target control device 22, and a gas control device 24.

The laser apparatus 12 may be a master oscillator power amplifier (MOPA) system. The laser apparatus 12 may include a master oscillator (not illustrated), a light isolator (not illustrated), and a plurality of $CO_2$ laser amplifiers (not illustrated). A wavelength of a laser beam output from the master oscillator is, for example, 10.59 μm, and a predetermined repetition frequency is, for example, 100 kHz. The master oscillator may be achieved by a solid-state laser.

The laser beam transmission device 14 includes an optical component for defining the traveling direction of a laser beam, and an actuator for adjusting the position, the posture, and the like of the optical component. The laser beam transmission device 14 illustrated in FIG. 1 includes a first high reflectance mirror 31 and a second high reflectance mirror 32 in the optical component for defining the traveling direction of a laser beam.

The laser beam condensation optical system 16 includes a light condensation lens 34, a light condensation lens holder 35, and a triaxial stage 36. The triaxial stage 36 is movable in the directions of the three axes of an X axis, a Y axis, and a Z axis orthogonal to one another. In FIG. 1, the Z axis is defined to be a direction in which EUV light is guided from the chamber 18 toward an exposure apparatus 100. The X axis is defined to be a direction orthogonal to the sheet of FIG. 1, and the Y axis is defined to be a longitudinal direction parallel to the sheet. The laser beam condensation optical system 16 condenses a laser beam transmitted through the laser beam transmission device 14 to a plasma generation region 64 in the chamber 18.

The chamber 18 is a sealable container. The chamber 18 may be formed in, for example, a hollow spherical shape or a tubular shape. The chamber 18 includes an EUV light condensation mirror 40, a plate 41, an EUV light condensation mirror holder 42, a first window 44, and a first cover 45. The chamber 18 also includes a target supply unit 50, a biaxial stage 51, a droplet receiver 52, a droplet detection device 54, an EUV optical sensor unit 60, a gas supply device 61, an exhaust device 62, and a pressure sensor 63.

The wall of the chamber 18 is provided with at least one through-hole. The through-hole is blocked by the first window 44. A pulse laser beam 48 output from the laser apparatus 12 transmits through the first window 44 via the light condensation lens 34.

The EUV light condensation mirror 40 has, for example, a spheroidal surface, and has a first focal point and a second focal point. For example, a multi-layer reflective film obtained by alternately stacking molybdenum and silicon is formed on the surface of the EUV light condensation mirror 40. The EUV light condensation mirror 40 is disposed so that, for example, the first focal point is positioned in the plasma generation region 64 and the second focal point is positioned at an intermediate focusing point (IF) 66. The EUV light condensation mirror 40 is provided with a through-hole 68 at a central part thereof through which the pulse laser beam 48 passes.

The plate 41 and the EUV light condensation mirror holder 42 are members holding the EUV light condensation mirror 40. The plate 41 is fixed to the chamber 18. The EUV light condensation mirror 40 is held by the plate 41 through the EUV light condensation mirror holder 42.

The first cover 45 is a shroud covering an optical path through which the pulse laser beam 48 is guided from the first window 44 to the plasma generation region 64 through the through-hole 68. The first cover 45 has a tubular shape of a substantially circular truncated cone shape tapered from the first window 44 toward the plasma generation region 64.

The target supply unit 50 supplies a target substance into the chamber 18, and is, for example, attached to penetrate through a wall of the chamber 18. The target supply unit 50 is attached to the wall of the chamber 18 through the biaxial stage 51. The biaxial stage 51 is an XZ-axis stage movable in the directions of the X axis and the Z axis. The position of the target supply unit 50 on the XZ plane can be adjusted by the biaxial stage 51.

The material of the target substance may include tin, terbium, gadolinium, lithium, xenon, or a combination of two or more of these materials, but is not limited thereto. The target supply unit 50 outputs a droplet 56 formed of the target substance toward the plasma generation region 64 inside the chamber 18.

The target control device 22 is connected with each of the EUV light generation control device 20, the laser apparatus 12, the target supply unit 50, and the droplet detection device 54. The target control device 22 controls operation of the target supply unit 50 in accordance with a command from the EUV light generation control device 20. The target control device 22 also controls the output timing of the pulse laser beam 48 from the laser apparatus 12 based on a detection signal from the droplet detection device 54.

The droplet detection device 54 detects one or a plurality of the existence, locus, position, and speed of the droplet 56. The droplet detection device 54 is disposed to detect trajectory change in the X direction. The droplet detection device 54 includes a light source unit 70 and a light receiving unit 75.

The light source unit 70 includes a light source 71, an illumination optical system 72, a second window 73, and a second cover 74. The light source 71 may be, for example, a lamp or a semiconductor laser. The illumination optical system 72 may be a light condensation lens configured to illuminate the droplet trajectory with light output from the light source 71.

The light receiving unit 75 includes a transfer optical system 76, a first optical sensor 77, a third window 78, and a third cover 79. The transfer optical system 76 may be a lens through which an image of the droplet 56 being illuminated is transferred onto an element of the first optical sensor 77. The first optical sensor 77 may be a two-dimensional image sensor such as a charge-coupled device (CCD).

The chamber 18 includes another droplet detection device (not illustrated) to detect deviation of the trajectory of the droplet 56 in the Z direction.

The droplet receiver 52 is disposed on an extended line in a direction in which the droplet 56 output from the target supply unit 50 into the chamber 18 travels. In FIG. 1, the droplet 56 falls in a direction parallel to the Y axis, and the droplet receiver 52 is disposed at a position facing the target supply unit 50 in the Y direction.

The EUV light generation apparatus 11 includes a connection part 82 that provides communication between the inside of the chamber 18 and the inside of the exposure apparatus 100. A wall 86 on which an aperture 84 is formed is provided inside the connection part 82. The wall 86 is disposed so that the aperture 84 is positioned at the second focal point of the EUV light condensation mirror 40.

The exposure apparatus 100 includes an exposure apparatus controller 102 connected with the EUV light generation control device 20.

The EUV optical sensor unit 60 detects EUV light generated in the chamber 18. The EUV optical sensor unit 60 is connected with the EUV light generation control device 20. A plurality of EUV optical sensor units 60 may be provided so that plasma can be observed at a plurality of positions different from each other. Although FIG. 1 illustrates one EUV optical sensor unit 60, the EUV optical sensor units 60 are preferably installed at a plurality of places around the chamber 18.

The gas supply device 61 is connected with a space inside each of the first cover 45, the second cover 74, the third cover 79, and the EUV optical sensor unit 60 through a pipe 90. In addition, the gas supply device 61 is connected with a pipe 91 through which gas flows onto the surface of the EUV light condensation mirror 40. The gas supply device 61 is a gas supply source configured to supply gas to the pipes 90 and 91. The gas supply device 61 may be, for example, a hydrogen gas supply device configured to supply hydrogen gas.

Hydrogen gas is exemplary purge gas. The purge gas is not limited to hydrogen gas and may be gas containing hydrogen. The purge gas is preferably gas that can generate compound gas through reaction with the material of the target substance. The kind of the purge gas is selected based on the relation in the material of the target substance.

The gas control device 24 is connected with each of the EUV light generation control device 20, the gas supply device 61, the exhaust device 62, and the pressure sensor 63. The exhaust device 62 discharges gas in the chamber 18 to the outside of the chamber 18. The pressure sensor 63 detects the pressure in the chamber 18. A detection signal from the pressure sensor 63 is transferred to the gas control device 24. The gas control device 24 controls operation of the gas supply device 61 and the exhaust device 62 in accordance with a command from the EUV light generation control device 20.

The EUV light generation control device 20 collectively controls the entire EUV light generation system 10. The EUV light generation control device 20 processes a result of detection by the EUV optical sensor unit 60. The EUV light generation control device 20 may control the output timing of the droplet 56, the output direction of the droplet 56, and the like based on a result of detection by the droplet detection device 54. In addition, the EUV light generation control device 20 may control the oscillation timing of the laser apparatus 12, the traveling direction of the pulse laser beam 48, the condensation position of the pulse laser beam 48, and the like. These various kinds of control are merely exemplary, and may include other control as necessary, and some control functions may be omitted.

In the present disclosure, control devices such as the EUV light generation control device 20, the target control device 22, the gas control device 24, and the exposure apparatus controller 102 can be achieved by hardware and software combination of one or a plurality of computers. The software is synonymous with a computer program. The functions of a plurality of control devices can be achieved by a single control device. In addition, in the present disclosure, the EUV light generation control device 20, the target control device 22, the gas control device 24, the exposure apparatus controller 102, and the like may be connected with each other through a communication network such as a local area network or the Internet. In a distributed computing environment, a computer program unit may be stored in local and remote memory storage devices.

Figure 2:
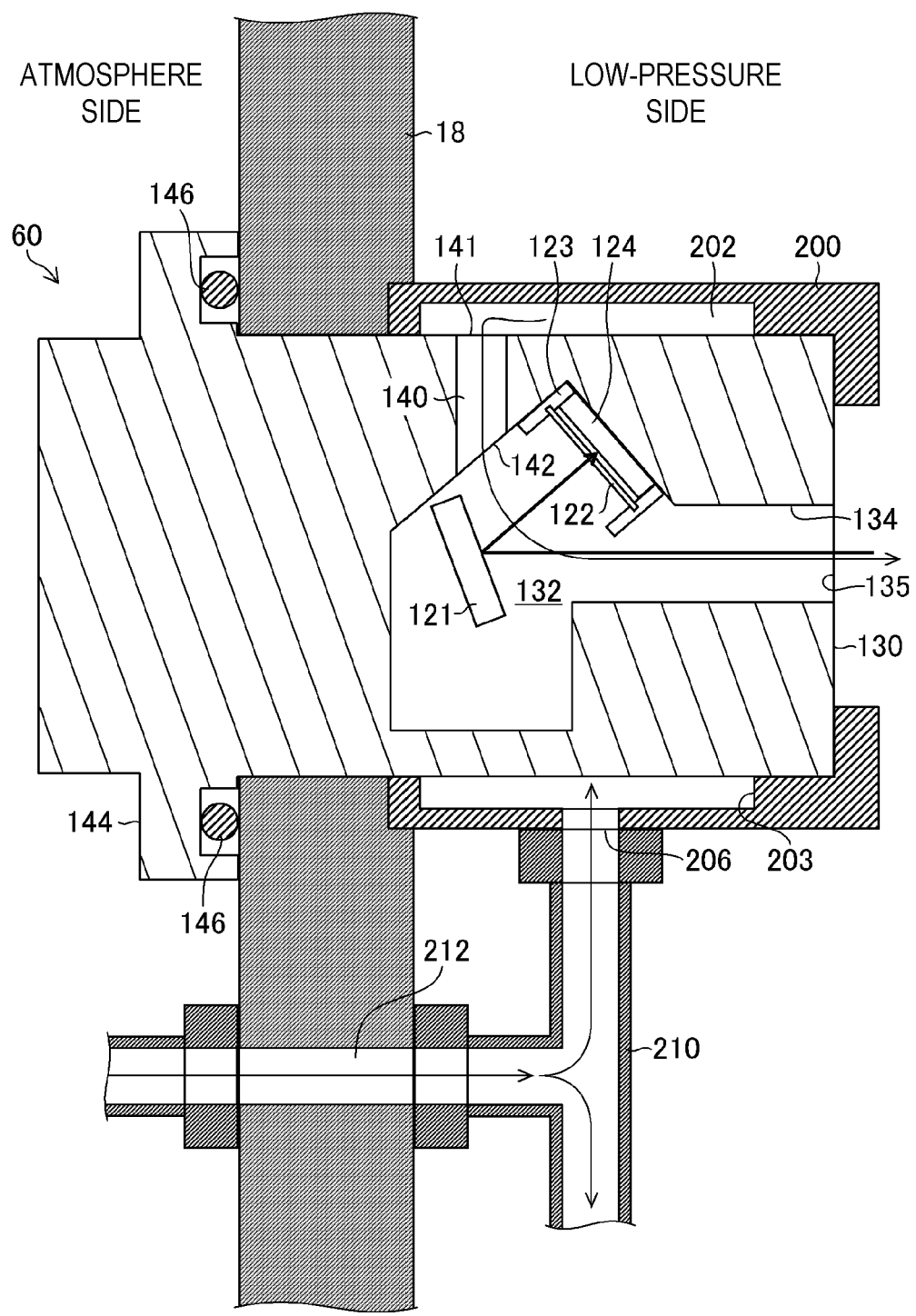
FIG. 2 is a diagram schematically illustrating an exemplary configuration of an EUV optical sensor unit.

FIG. 2 is a schematic configuration diagram illustrating an exemplary EUV optical sensor unit 60. The EUV optical sensor unit 60 is attached through the wall of the chamber 18 in which EUV light is generated. In FIG. 2, the right side of the wall of the chamber 18 is the inner side of the chamber 18, in other words, a low-pressure side, and the left side of the wall of the chamber 18 is an atmosphere side.

The EUV optical sensor unit 60 includes an EUV light reflection mirror 121, a filter 122, and a second optical sensor 124. The EUV light reflection mirror 121 is formed of a multi-layer reflective film configured to selectively reflect light including EUV light among light radiated from plasma. The EUV light reflection mirror 121 may be formed of, for example, a Mo/Si multi-layered film obtained by alternately stacking molybdenum (Mo) and silicon (Si).

The filter 122 is a wavelength filter configured to selectively transmit light having the wavelength of EUV light among light reflected by the EUV light reflection mirror 121. The wavelength of EUV light that the filter 122 transmits is, for example, 13.5 nm. The filter 122 is, for example, a metal thin film filter having a film thickness 300 to 600 nm. The filter 122 may be, for example, a metal thin film filter made of zirconium (Zr). The film thickness of the filter 122 is, for example, 350 nm.

The filter 122 is disposed to cover the light receiving surface of the second optical sensor 124. EUV light having a desired wavelength can be made incident on the second optical sensor 124 by combining the reflection characteristic of the EUV light reflection mirror 121 and the transmission characteristic of the filter 122.

The second optical sensor 124 is a sensor such as a photodiode configured to detect the energy of incident light. The second optical sensor 124 outputs an electric signal in accordance with received light intensity. The signal output from the second optical sensor 124 is transferred to the EUV light generation control device 20.

The EUV optical sensor unit 60 includes a hollow case 130 housing the EUV light reflection mirror 121, the filter 122, and the second optical sensor 124. The case 130 includes an optical component housing part 132, a cylindrical part 134, and a first gas supply part 140.

The optical component housing part 132 is a space in which the EUV light reflection mirror 121, the filter 122, and the second optical sensor 124 are housed. The EUV light reflection mirror 121 is held by a mirror holder (not illustrated). The second optical sensor 124 is attached to part of the wall surface of the case 130, which defines the optical component housing part 132. The filter 122 is held by a filter holder 123 and disposed in front of the second optical sensor 124.

The cylindrical part 134 includes an opening 135 as a light entrance port for plasma light including EUV light. Part of the cylindrical part 134 including the opening 135 is disposed inside the chamber 18. Plasma light incident through the opening 135 is incident on the EUV light reflection mirror 121 through the cylindrical part 134.

The first gas supply part 140 is a gas supply path disposed to supply the purge gas to the space between the EUV light reflection mirror 121 and the filter 122. The first gas supply part 140 includes a first gas introduction port 141 and a first gas flow-out port 142. The purge gas introduced into the case 130 through the first gas introduction port 141 is ejected through the first gas flow-out port 142 of the first gas supply part 140, passes through the cylindrical part 134, and flows out into the chamber 18 through the opening 135.

In FIG. 2, an arrow passing through the first gas supply part 140 and the cylindrical part 134 and extending from the opening 135 expresses gas flow. In addition, an arrow extending from the opening 135, passing through the cylindrical part 134, and reflected by the EUV light reflection mirror 121 toward the filter 122 and the second optical sensor 124 expresses the optical path of plasma light or EUV light.

The case 130 includes a flange part 144. The EUV optical sensor unit 60 is inserted into the through-hole provided to the wall of the chamber 18 from the atmosphere side and is fixed to the chamber 18 through the flange part 144. In other words, the flange part 144 of the case 130 is disposed outside the chamber 18 and is fixed to the wall of the chamber 18 through a gasket 146.

A socket 200 into which the case 130 of the EUV optical sensor unit 60 is inserted is disposed on the inside of the chamber 18, in other words, on the low-pressure side. The socket 200 is formed to cover part of the case 130 of the EUV optical sensor unit 60 on the low-pressure side.

The case 130 of the EUV optical sensor unit 60 can be inserted into the socket 200 from the atmosphere side of the chamber 18 and can be fitted to the socket 200 in the chamber 18. In the fitted state illustrated in FIG. 2, the case 130 can be pulled toward the atmosphere side and can be detached from the socket 200.

The socket 200 is configured so that a gap 202 is formed between the outer wall of the case 130 and the inner wall of the socket 200 when the socket 200 is joined with the case 130 of the EUV optical sensor unit 60. The gap 202 may be formed across the entire circumference of the inner wall of the socket 200. When the case 130 of the EUV optical sensor unit 60 is inserted from the atmosphere side of the chamber 18, the gap 202 is formed between the inner wall of the socket 200 and the outer wall of the case 130, and functions as a gas path. In this state, the inner wall of the socket 200 and the outer wall of the case 130 do not need to be in a completely sealed state, and may include no seal structure. A recess 203 of the inner wall of the socket 200, which can form the gap 202 corresponds to a form of "gas path formation part".

The socket 200 is provided with a pipe connection part 206. The pipe connection part 206 is connected with a pipe 210 through which gas is supplied. The pipe 210 is provided on the entire inner wall of the chamber 18. The inside of the pipe 210 connected with the pipe connection part 206 is communicated with the gap 202. The pipe 210 provided on the entire inner wall of the chamber 18 may supply gas to a plurality of EUV optical sensor units.

The pipe 210 is connected with the gas supply device 61 through a feed through 212. The feed through 212 through which gas is fed from the atmosphere side of the chamber 18 into the pipe 210 on a vacuum side may be provided at one place.

The first gas introduction port 141 is formed at part of the outer wall of the case 130 of the EUV optical sensor unit 60, which faces the gap 202. The first gas supply part 140 connecting the first gas introduction port 141 and the first gas flow-out port 142 is formed to blow gas introduced in the case 130 toward the EUV light reflection mirror 121. The first gas supply part 140 is configured not to directly blow gas to the filter 122.

Accordingly, the first gas flow-out port 142 is opened toward the EUV light reflection mirror 121 so that gas flowing out of the first gas flow-out port 142 is blown to the EUV light reflection mirror 121. In other words, the first gas flow-out port 142 is provided at a position where the purge gas is directly blown to the EUV light reflection mirror 121. The first gas flow-out port 142 is provided at a position not facing the filter 122 so that gas is not directly blown to the filter 122. This is to reduce deformation and damage of the filter 122, which is extremely thin as described above, due to gas blown thereto.

2.2 Operation

The following describes operation of the exemplary LPP EUV light generation system 10 with reference to FIGS. 1 and 2. When the EUV light generation system 10 outputs EUV light, an EUV light output command is transferred from the exposure apparatus controller 102 of the exposure apparatus 100 to the EUV light generation control device 20.

The EUV light generation control device 20 transmits a control signal to the gas control device 24. The gas control device 24 controls, based on a value detected by the pressure sensor 63, the gas supply device 61 and the exhaust device 62 so that the pressure in the chamber 18 becomes in a predetermined range.

The predetermined range of the pressure in the chamber 18 is, for example, several to several hundred Pa. Hydrogen gas fed out from the gas supply device 61 is supplied, through the pipe 90, into each of the first cover 45, the second cover 74, and the third cover 79 and into the EUV optical sensor unit 60. The hydrogen gas fed out from the gas supply device 61 is also supplied to the reflective surface of the EUV light condensation mirror 40 through the pipe 91.

The hydrogen gas supplied into the first cover 45 is ejected through an opening 45A of the first cover 45. The hydrogen gas supplied into the second cover 74 is ejected through an opening 74A of the second cover 74. The hydrogen gas supplied into the third cover 79 is ejected through an opening 79A of the third cover 79. The hydrogen gas supplied into the EUV optical sensor unit 60 is ejected through the opening 135 of the EUV optical sensor unit 60.

The gas control device 24 transmits a signal to the EUV light generation control device 20 when the internal pressure of the chamber 18 has become in a predetermined range. After having received the signal from the gas control device 24 transferred, the EUV light generation control device 20 transmits a droplet output instruction signal instructing droplet output to the target control device 22.

Having received the droplet output instruction signal, the target control device 22 transmits a droplet output signal to the target supply unit 50 and causes the target supply unit 50 to output the droplet 56. The droplet 56 may be a melted tin (Sn) droplet.

The trajectory of the droplet 56 output from the target supply unit 50 is detected by the droplet detection device 54. A detection signal of the detection by the droplet detection device 54 is transferred to the target control device 22.

The target control device 22 may transmit a feedback signal to the biaxial stage 51 based on the detection signal obtained from the droplet detection device 54 so that the trajectory of the droplet 56 becomes a desired trajectory.

Once the trajectory of the droplet 56 has become stable, the target control device 22 outputs a trigger signal delayed by a predetermined time to the laser apparatus 12 in synchronization with the output signal of the droplet 56. This delay time is set so that the droplet 56 is irradiated with a laser beam when the droplet 56 reaches the plasma generation region 64.

The laser apparatus 12 outputs a laser beam in synchronization with the trigger signal. The power of the laser beam output from the laser apparatus 12 reaches several kW to several ten kW. The laser beam output from the laser apparatus 12 is incident on the light condensation lens 34 of the laser beam condensation optical system 16 through the laser beam transmission device 14. The laser beam incident on the light condensation lens 34 is condensed through the light condensation lens 34 and is input to the chamber 18 through the first window 44. The droplet 56 having reached the plasma generation region 64 is irradiated with the laser beam incident on the chamber 18.

The droplet 56 is irradiated with at least one pulse included in the pulse laser beam 48. Plasma is generated when the droplet 56 is irradiated with the pulse laser beam, and radiates radiation light 106. EUV light 108 included in the radiation light 106 is selectively reflected by the EUV light condensation mirror 40. The EUV light 108 reflected by the EUV light condensation mirror 40 is condensed at the intermediate focusing point 66 and is output to the exposure apparatus 100. One droplet 56 may be irradiated with a plurality of pulses included in the pulse laser beam 48.

The droplet receiver 52 collects part of the droplet 56 not irradiated with the laser beam but having passed through the plasma generation region 64 and the droplet not having diffused through irradiation with the laser beam.

Plasma is generated when the droplet 56 is irradiated with the laser beam. The energy of the generated plasma may be measured by the EUV optical sensor unit 60 to measure the energy of EUV light included in the generated plasma light.

Part of the radiation light 106 as plasma light enters the EUV optical sensor unit 60 through the opening 135 and is incident on the EUV light reflection mirror 121 through the cylindrical part 134. The EUV light reflection mirror 121 reflects EUV light included in the radiation light 106 toward the filter 122. Only light having a wavelength in the EUV wavelength region among light incident on the filter 122 transmits through the filter 122. The EUV light having transmitted through the filter 122 reaches the light receiving surface of the second optical sensor 124. A photodiode of the second optical sensor 124 outputs a signal corresponding to the energy of the received EUV light. The energy of the EUV light can be detected based on the signal output from the second optical sensor 124.

When a plurality of EUV optical sensor units 60 are disposed, the position of plasma can be calculated from the detection position of each EUV optical sensor unit and its detected energy.

When the droplet 56 is a melted Sn droplet, Sn debris is generated along with plasma generation and diffuses into the chamber 18. In this case, the Sn debris means Sn fine particles. The diffusing Sn debris reaches the opening 45A of the first cover 45, the opening 74A of the second cover 74, the opening 79A of the third cover 79, and the opening 135 of the EUV optical sensor unit 60.

Hydrogen gas is ejected through each of the opening 45A of the first cover 45, the opening 74A of the second cover 74, the opening 79A of the third cover 79, and the opening 135 of the EUV optical sensor unit 60. This can prevent the Sn debris from reaching the first window 44, the second window 73, the third window 78, and the EUV light reflection mirror 121 in the EUV optical sensor unit 60.

When gas supplied to the surface of the EUV light condensation mirror 40 contains hydrogen, the Sn debris accumulated on the EUV light condensation mirror 40 and the hydrogen reacts with each other and generates stannane gas ($SnH_4$). The stannane gas is discharged out of the chamber 18 by the exhaust device 62.

Similarly, when gas containing hydrogen is supplied around the first window 44, the second window 73, and the third window 78, the Sn debris can be prevented from accumulating on the first window 44, the second window 73, and the third window 78.

At least during EUV light generation, hydrogen gas is ejected through the first gas flow-out port 142 of the first gas supply part 140 in the EUV optical sensor unit 60 and is blown to the EUV light reflection mirror 121. In other words, the purge gas is supplied to the space between the EUV light reflection mirror 121 and the filter 122 from a reflected light path side of the EUV light reflection mirror 121.

A reflected light path of the EUV light reflection mirror 121 is the optical path of EUV light reflected by the EUV light reflection mirror 121 and traveling toward the filter 122. An incident light path of the EUV light reflection mirror 121 is the optical path of plasma light passing through the opening 135 and incident on the EUV light reflection mirror 121 through the cylindrical part 134. The incident light path of plasma light to the EUV light reflection mirror 121 is referred to as a first optical path. The reflected light path of EUV light traveling from the EUV light reflection mirror 121 toward the filter 122 is referred to as a second optical path. The first gas flow-out port 142 of the first gas supply part 140 is provided at a position closer to the second optical path than the first optical path.

In other words, the axis of the gas supply path of the first gas supply part 140 intersects the second optical path, and thus gas blown out from the first gas flow-out port 142 intersects the second optical path and then flows toward the first optical path. The first gas supply part 140 supplies the purge gas to the space between the EUV light reflection mirror 121 and the filter 122 from the position closer to the second optical path than the first optical path.

The hydrogen gas ejected through the first gas flow-out port 142 flows between the EUV light reflection mirror 121 and the filter 122, passes through the cylindrical part 134, and flows out into the chamber 18 through the opening 135.

The EUV light reflection mirror 121 corresponds to a form of "mirror configured to reflect extreme ultraviolet light". The second optical sensor 124 corresponds to a form of "optical sensor configured to detect extreme ultraviolet light having transmitted through a wavelength filter". The cylindrical part 134 corresponds to a form of "pipe part".

3. Problem

The EUV optical sensor unit 60 illustrated in FIG. 2 can prevent Sn debris from reaching the EUV light reflection mirror 121 by supplying gas into the case 130 and ejecting the gas through the opening 135 via the cylindrical part 134.

When Sn debris enters, hydrogen and Sn are more likely to react with each other and the Sn debris can be more reliably turned into stannane gas as the cylindrical part 134 has a smaller inner diameter and a longer length L. However, there are problems as follows.

[Problem 1] Since the EUV optical sensor unit 60 is mounted on the chamber 18, the EUV optical sensor unit 60 has a restricted size and needs to be designed to achieve space saving. In addition, EUV light propagates as the beam diameter thereof spreads, and thus the gap between the filter 122 and the second optical sensor 124 is narrowed to converge EUV light to the effective range of the photodiode of the second optical sensor 124.

[Problem 2] Since the gap between the filter 122 and the second optical sensor 124 is narrow, gas supplied into the EUV optical sensor unit 60 through the first gas supply part 140 hardly flows into the gap between the filter 122 and the second optical sensor 124.

[Problem 3] A bonding agent containing carbon is used for the filter 122 and the second optical sensor 124. Residual carbon in atmosphere or carbon having vaporized from the bonding agent used for the filter 122 and the second optical sensor 124 can accumulate in an EUV irradiation region between the filter 122 and the second optical sensor 124 during EUV irradiation. Carbon having accumulated on the filter 122 and/or the surface of the second optical sensor 124 decreases the detection sensitivity of the second optical sensor 124 and hinders energy measurement.

[Problem 4] When gas is purged near the filter 122 and the second optical sensor 124 to reduce the carbon accumulation indicated as Problem 3, any pressure difference between both surfaces of the filter 122 leads to damage on the filter 122 and hinders energy measurement.

4. Embodiment 1

4.1 Configuration

Figure 3:
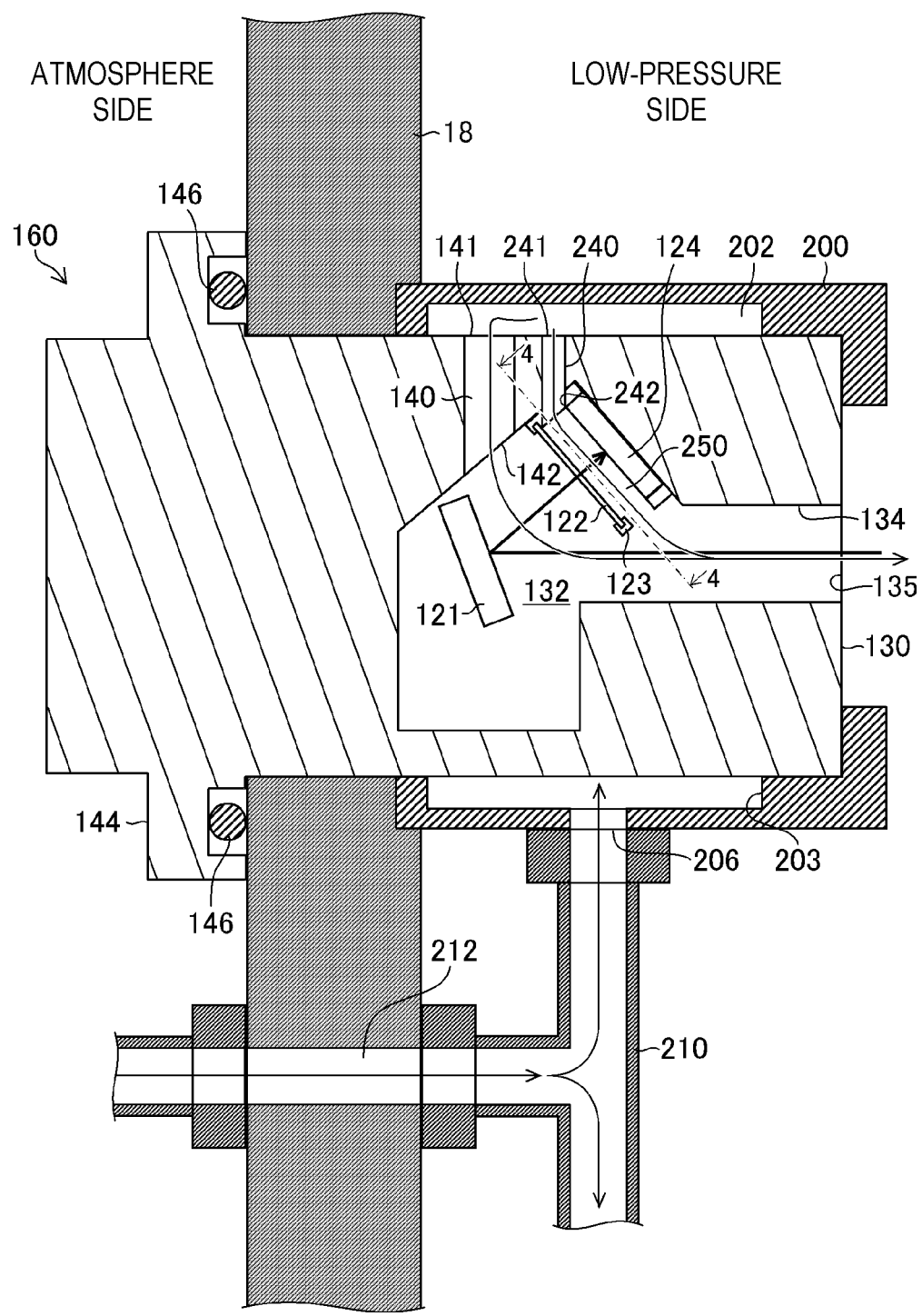
FIG. 3 is a cross-sectional view schematically illustrating the configuration of an EUV optical sensor unit according to Embodiment 1.
Figure 4:
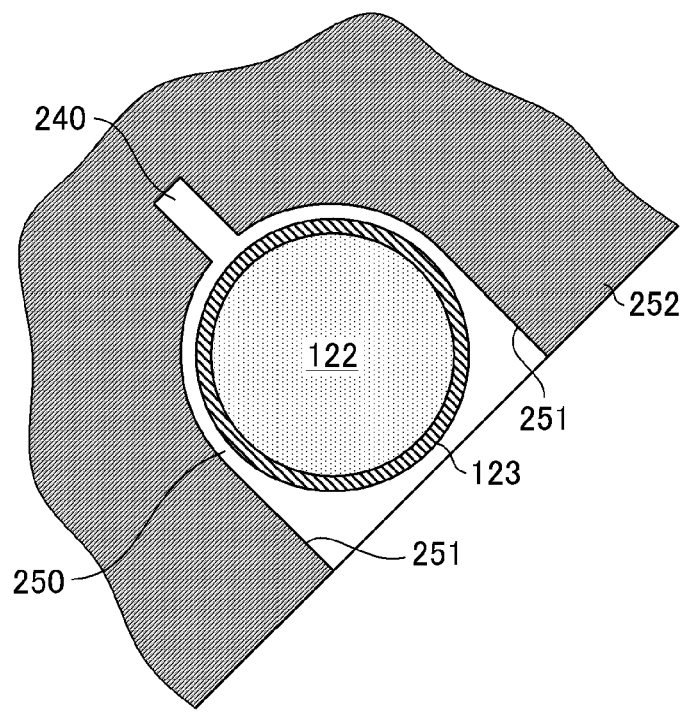
FIG. 4 is a cross-sectional view taken along line 4-4 in FIG. 3.

FIG. 3 is a cross-sectional view schematically illustrating the configuration of an EUV optical sensor unit according to Embodiment 1. The following describes any difference of Embodiment 1 illustrated in FIG. 3 from the configuration described with reference to FIG. 2. An EUV optical sensor unit 160 illustrated in FIG. 3 can be used in place of the EUV optical sensor unit 60 described with reference to FIG. 2. FIG. 4 is a cross-sectional view taken along line 4-4 in FIG. 3.

The EUV optical sensor unit 160 according to Embodiment 1 includes a second gas supply part 240 disposed to supply the purge gas to the gap between the filter 122 and the second optical sensor 124. The second gas supply part 240 is a gas supply path including a second gas introduction port 241 and a second gas flow-out port 242. The case 130 includes a flow path structure part as the second gas supply part 240.

The second gas introduction port 241 is formed at part of the outer wall of the case 130, which faces the gap 202. The second gas flow-out port 242 is a gas flow-out port through which the purge gas is blown out toward the space between the EUV light reflection mirror 121 and the filter 122. The second gas supply part 240 connected with the second gas introduction port 241 and the second gas flow-out port 242 is formed to guide gas introduced into the case 130 to the gap between the filter 122 and the second optical sensor 124.

The gas introduced into the case 130 through the second gas introduction port 241 is ejected through the second gas flow-out port 242 of the second gas supply part 240, passes through the gap between the filter 122 and the second optical sensor 124, and flows out into the chamber 18 through the opening 135. A space 250 of the gap formed between the filter 122 and the second optical sensor 124 serves as a gas flow path through which the purge gas flows.

The first gas supply part 140 and the second gas supply part 240 are each communicated with the gap 202 between the socket 200 and the outer wall of the case 130, and gas flows to each of the first gas supply part 140 and the second gas supply part 240 through the gap 202. A desired ratio can be achieved between the flow rate of the first gas supply part 140 and the flow rate of the second gas supply part 240 by adjusting the gas flow path conductance of each part.

The first gas supply part 140 may be achieved by using, for example, a pipe having constant flow path cross-sectional area. Similarly, the second gas supply part 240 may be achieved by using, for example, a pipe having constant flow path cross-sectional area. In this case, the flow path cross-sectional area ratio of the first gas supply part 140 to the second gas supply part 240 may be, for example, 5:1 to 15:1.

As illustrated in FIG. 4, a side surface 251 of a gas flow path including the space 250 between the filter 122 and the second optical sensor 124 is blocked by a wall member 252 so that gas supplied to the space 250 between the filter 122 and the second optical sensor 124 through the second gas supply part 240 flows in one direction without diffusing. The wall member 252 may be part of a spacer by which the filter 122 and the second optical sensor 124 are separated from each other by a predetermined distance.

Figure 5:
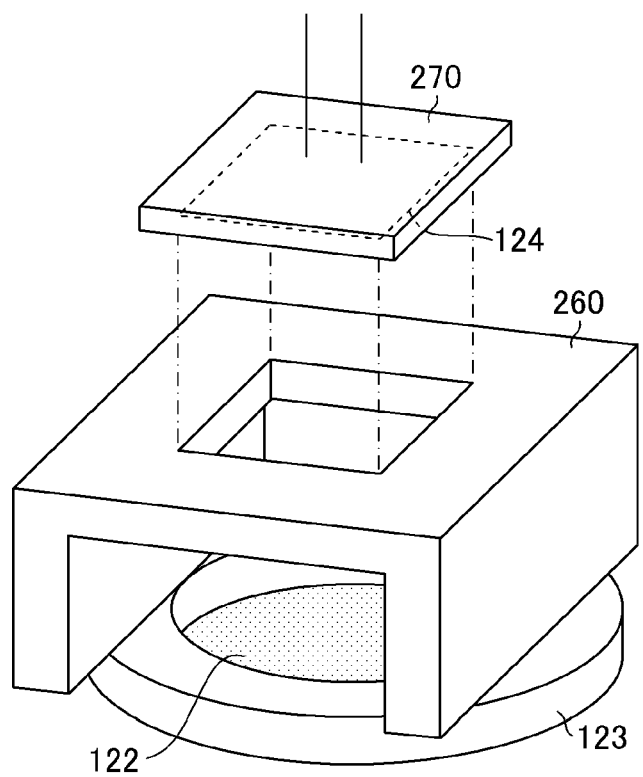
FIG. 5 is a perspective view illustrating an exemplary spacer.
Figure 6:
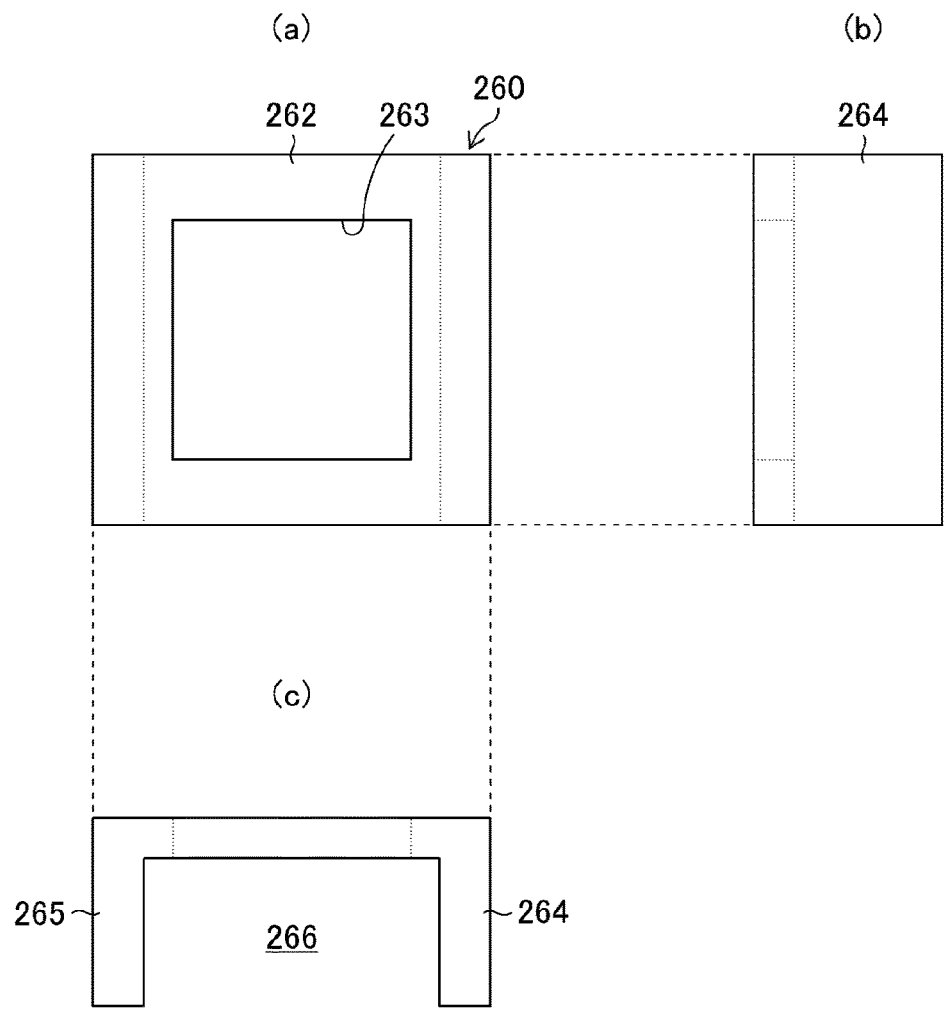
FIG. 6 includes three-plane views of the spacer: a plan view in (a); a side view in (b); and a front view in (c).

FIG. 5 is a perspective view illustrating an exemplary spacer. FIG. 6 includes three-plane views of a spacer 260 illustrated in FIG. 5. In FIG. 6, (a) is a plan view, (b) is a side view, and (c) is a front view. The spacer 260 has a structure in which a first plate 262 contacting a sensor holder 270 of the second optical sensor 124, and a second plate 264 and a third plate 265 contacting the filter holder 123 are combined with each other in a U shape.

The first plate 262 is provided with a through-hole 263 through which EUV light passes. The second optical sensor 124 is fixed to the sensor holder 270. The sensor holder 270 holding the second optical sensor 124 contacts the first plate 262 while the position of the second optical sensor 124 is aligned with the through-hole 263 of the first plate 262.

The second plate 264 and the third plate 265 correspond to the wall member 252 described with reference to FIG. 3. The filter 122 and the second optical sensor 124 are separated from each other by the spacer 260 by the predetermined distance. A desired distance can be designed between the filter 122 and the light receiving surface of the second optical sensor 124 by using the spacer 260. For example, the distance between the filter 122 and the light receiving surface of the second optical sensor 124 is 1.5 mm in the example illustrated in FIG. 2, but is set to be 4.0 mm in Embodiment 1 illustrated in FIG. 3.

A space 266 having the second plate 264 and the third plate 265 as side wall surfaces in (c) of FIG. 6 serves as the space 250 through which the purge gas flows.

Figure 7:
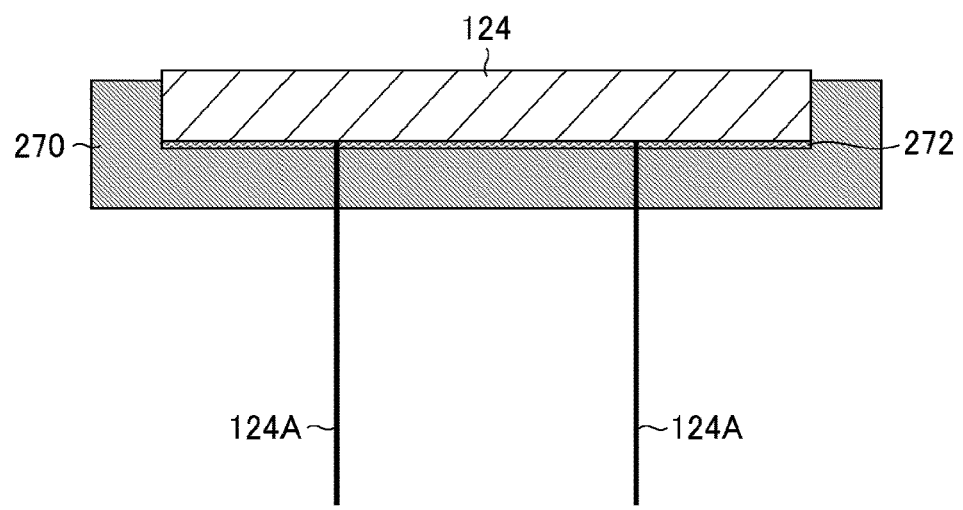
FIG. 7 is a cross-sectional view of a second optical sensor fixed to a sensor holder.

FIG. 7 is a cross-sectional view of the second optical sensor 124 held by the sensor holder 270. The second optical sensor 124 is fixed to the sensor holder 270. The sensor holder 270 is a frame body covering the back surface and side surfaces of the second optical sensor 124. The second optical sensor 124 is fixed to the sensor holder 270 by a bonding agent 272. The bonding agent 272 contains carbon. The bonding agent 272 is used between the back surface of the second optical sensor 124 and the sensor holder 270. A signal line 124A is connected with the back surface of the second optical sensor 124. The signal line 124A is extended through a through-hole formed at the sensor holder 270 and is connected with an electric circuit (not illustrated). The sensor holder 270 is an exemplary holder holding the second optical sensor 124.

Figure 8:
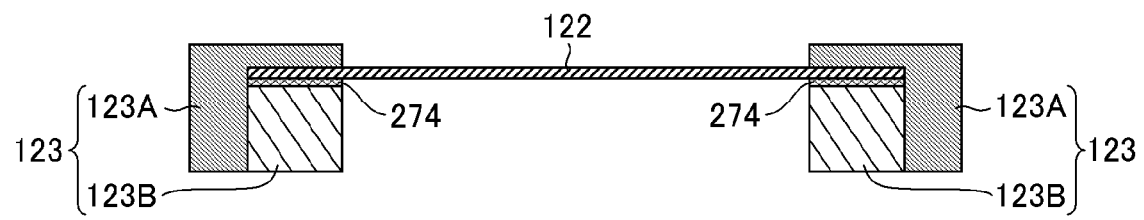
FIG. 8 is a cross-sectional view of a filter fixed to a filter holder.

FIG. 8 is a cross-sectional view of the filter 122 fixed to the filter holder 123. The filter holder 123 includes a holding frame 123A and a pressing member 123B. The filter 122 is fixed to the holding frame 123A by a bonding agent 274 and the pressing member 123B.

The bonding agent 274 contains carbon. The bonding agent 274 may be a bonding agent of a kind same as or different from the bonding agent 272 illustrated in FIG. 7. The bonding agent 274 is used between the filter 122 and the pressing member 123B. The filter 122 is fixed to the filter holder 123 while being sandwiched between the holding frame 123A and the pressing member 123B.

4.2 Operation

At least during EUV light generation, hydrogen gas is ejected through the second gas flow-out port 242 of the second gas supply part 240 in the EUV optical sensor unit 60, and the purge gas is supplied to the space 250 between the filter 122 and the second optical sensor 124. The purge gas flows through the space 250 between the filter 122 and the second optical sensor 124.

This flow of the purge gas removes carbon existing between the filter 122 and the second optical sensor 124.

The occurrence of pressure difference between both surfaces of the filter 122 can be reduced by appropriately setting the flow path cross-sectional area and flow path length of the second gas supply part 240. The pressure difference between both surfaces of the filter 122 is preferably equal to or smaller than 3 kPa. The flow ratio of the first gas supply part 140 to the second gas supply part 240 is preferably 8:1 to 12:1.

The EUV optical sensor unit 160 is an exemplary "extreme ultraviolet light sensor unit". The first gas supply part 140 is an exemplary "first purge gas supply unit". The purge gas supplied through the first gas supply part 140 is exemplary "first purge gas". The second gas supply part 240 is an exemplary "purge gas supply unit" and an exemplary "second purge gas supply unit". The purge gas supplied through the second gas supply part 240 is exemplary "second purge gas". The EUV light generation apparatus 11 including the EUV optical sensor unit 160 is an exemplary "extreme ultraviolet light generation apparatus".

4.3 Effect

According to Embodiment 1, it is possible to reduce transmittance decrease and sensitivity decrease due to adhesion of carbon to the filter 122 and the second optical sensor 124.

5. Embodiment 2

5.1 Configuration

Figure 9:
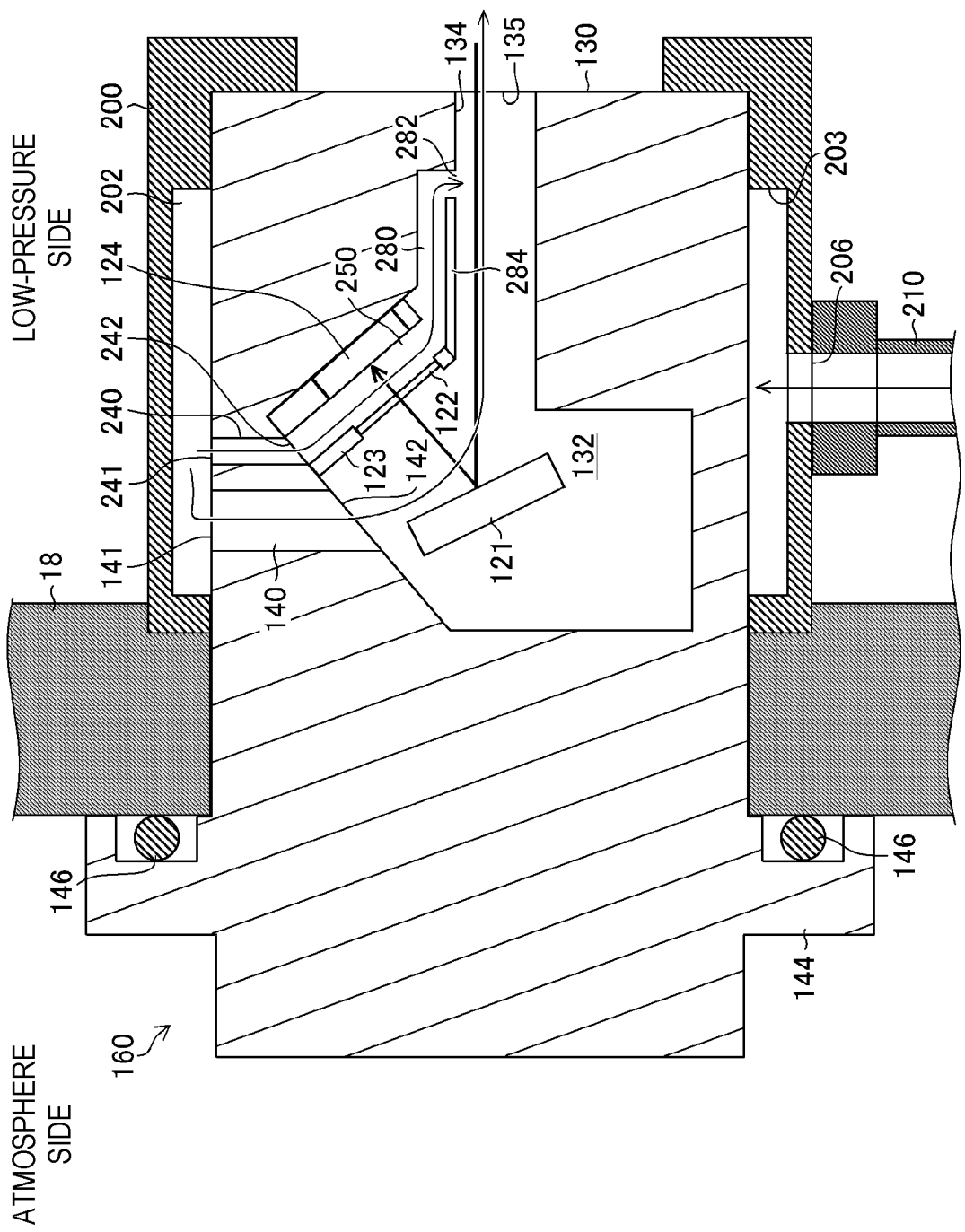
FIG. 9 is a cross-sectional view schematically illustrating the configuration of an EUV optical sensor unit according to Embodiment 2.

FIG. 9 is a cross-sectional view schematically illustrating the configuration of an EUV optical sensor unit according to Embodiment 2. The following describes any difference of Embodiment 2 illustrated in FIG. 9 from the configuration of Embodiment 1 described with reference to FIG. 3.

The second gas supply part 240 of the EUV optical sensor unit 160 according to Embodiment 2 has a flow path structure through which the purge gas is not directly blown out toward the surface of the filter 122. As illustrated in FIG. 9, the second gas supply part 240 is provided at a position not facing the filter 122.

The EUV optical sensor unit 160 according to Embodiment 2 includes a third flow path part 280 through which gas having passed through the space 250 between the filter 122 and the second optical sensor 124 is guided in a direction non-parallel to the surface of the filter 122. The third flow path part 280 in the present example has a flow path structure through which gas is guided in the lateral direction of FIG. 9. The third flow path part 280 functions as a purge gas ejection flow path that is communicated with the space 250 between the filter 122 and the second optical sensor 124 and through which the purge gas having passed between the filter 122 and the second optical sensor 124 is guided to a gas exit 282. The gas exit 282 of the third flow path part 280 is provided at a position separated from the second optical sensor 124. The gas exit 282 is opened downward in FIG. 9. The third flow path part 280 is connected with the cylindrical part 134 through the gas exit 282.

The purge gas ejection flow path achieved by the third flow path part 280 includes a flow path structure in which a gas flow path from the space 250 between the filter 122 and the second optical sensor 124 to the gas exit 282 is not straight.

The third flow path part 280 including the flow path structure including the non-straight path also functions as a shield structure that prevents scattered light including visible light from being incident on the second optical sensor 124. In other words, a flow path wall 284 of the third flow path part 280 functions as a shield member that prevents entry of scattered light into the space 250 between the filter 122 and the second optical sensor 124. With the flow path structure including the non-straight path, scattered light having entered through the gas exit 282 is unlikely to reach the light receiving surface of the second optical sensor 124.

5.2 Operation

Gas introduced through the second gas introduction port 241 passes through the second gas supply part 240 and is ejected through the second gas flow-out port 242. The gas flowing out of the second gas flow-out port 242 changes its flow direction through collision with a wall of the filter holder 123 or a flow path structure member coupled with the filter holder 123, and flows to the space 250 between the filter 122 and the second optical sensor 124.

The gas having flowed through the space 250 between the filter 122 and the second optical sensor 124 passes through the third flow path part 280 and is discharged through the gas exit 282.

5.3 Effect

According to Embodiment 2, effects same as those of Embodiment 1 can be obtained. In addition, according to Embodiment 2, since the second gas supply part 240 has the flow path structure in which the purge gas is not directly blown out toward the filter 122, damage on the filter 122 can be reduced. In addition, since Embodiment 2 has the structure with which scattered light is unlikely to be incident on the second optical sensor 124 through the flow path of the purge gas, it is possible to perform more accurate energy measurement.

6. Embodiment 3

6.1 Configuration

Figure 10:
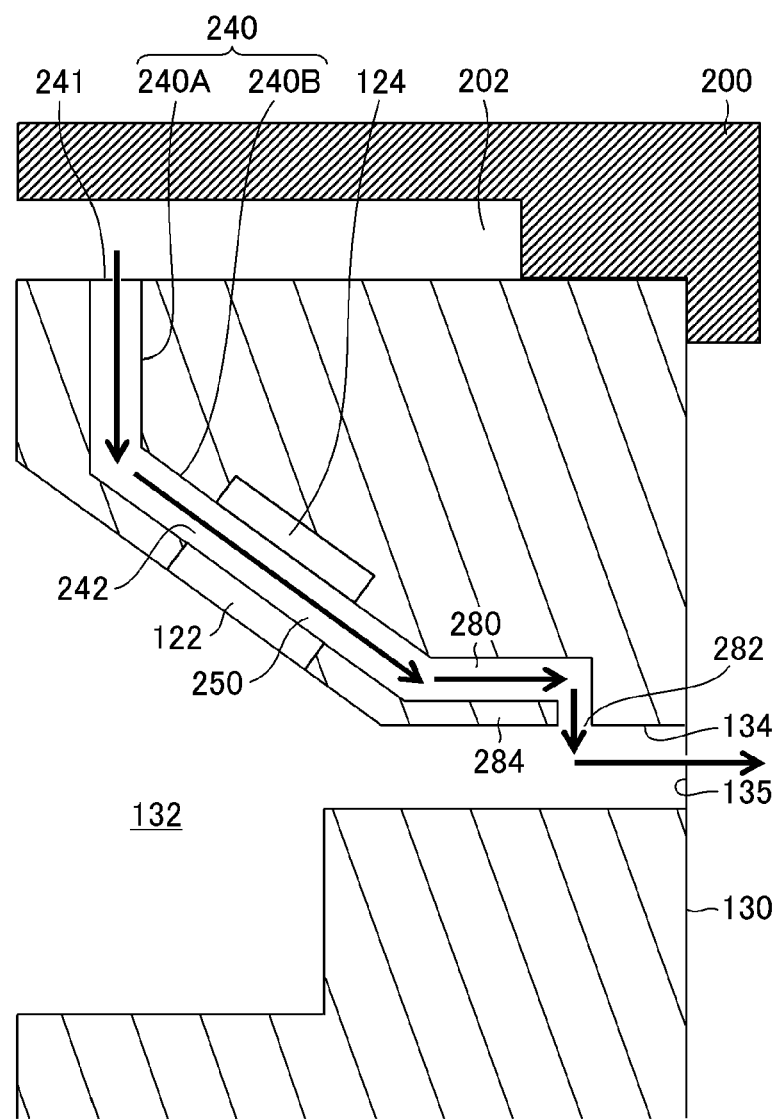
FIG. 10 is a cross-sectional view schematically illustrating a main part configuration of the EUV optical sensor unit according to Embodiment 3.

FIG. 10 is a cross-sectional view schematically illustrating a main part configuration of an EUV optical sensor unit according to Embodiment 3. FIG. 10 illustrates a flow path structure part through which the purge gas flows to the space 250 between the filter 122 and the second optical sensor 124. The following describes any difference of Embodiment 3 illustrated in FIG. 10 from the configuration of Embodiment 2 described with reference to FIG. 9. In FIG. 10, each arrow indicates the flow of the purge gas flowing between the filter 122 and the second optical sensor 124.

The second gas supply part 240 in Embodiment 3 includes a first flow path part 240A and a second flow path part 240B. The first flow path part 240A is a gas supply path through which gas is guided downward in FIG. 10 from the second gas introduction port 241. The direction of gas flow passing through the first flow path part 240A is referred to as a first direction. The second flow path part 240B is a gas supply path that is connected with the first flow path part 240A and through which gas is guided obliquely downward to the right in FIG. 10. The direction of gas flow passing through the second flow path part 240B is referred to as a second direction. The second direction intersects the first direction and is parallel to the surface of the filter 122.

The second gas supply part 240 has a configuration in which the direction of gas flow is bent at a part where the first flow path part 240A and the second flow path part 240B are connected with each other. The second flow path part 240B is connected with the space 250 between the filter 122 and the second optical sensor 124. A part where the second flow path part 240B and the space 250 are connected with each other corresponds to the second gas flow-out port 242. The second gas flow-out port 242 is provided at a position not facing the filter 122. The purge gas flowing out of the second gas flow-out port 242 flows in the second direction.

6.2 Operation

Gas introduced through the second gas introduction port 241 changes its flow direction through collision with the flow path wall of the second flow path part 240B at the part where the first flow path part 240A and the second flow path part 240B are connected with each other, and flows to the second flow path part 240B. The gas having passed through the second flow path part 240B flows to the space 250 between the filter 122 and the second optical sensor 124 through the second gas flow-out port 242.

6.3 Effect

According to Embodiment 3, effects same as those of Embodiment 2 can be obtained.

7. Embodiment 4

7.1 Configuration

Figure 11:
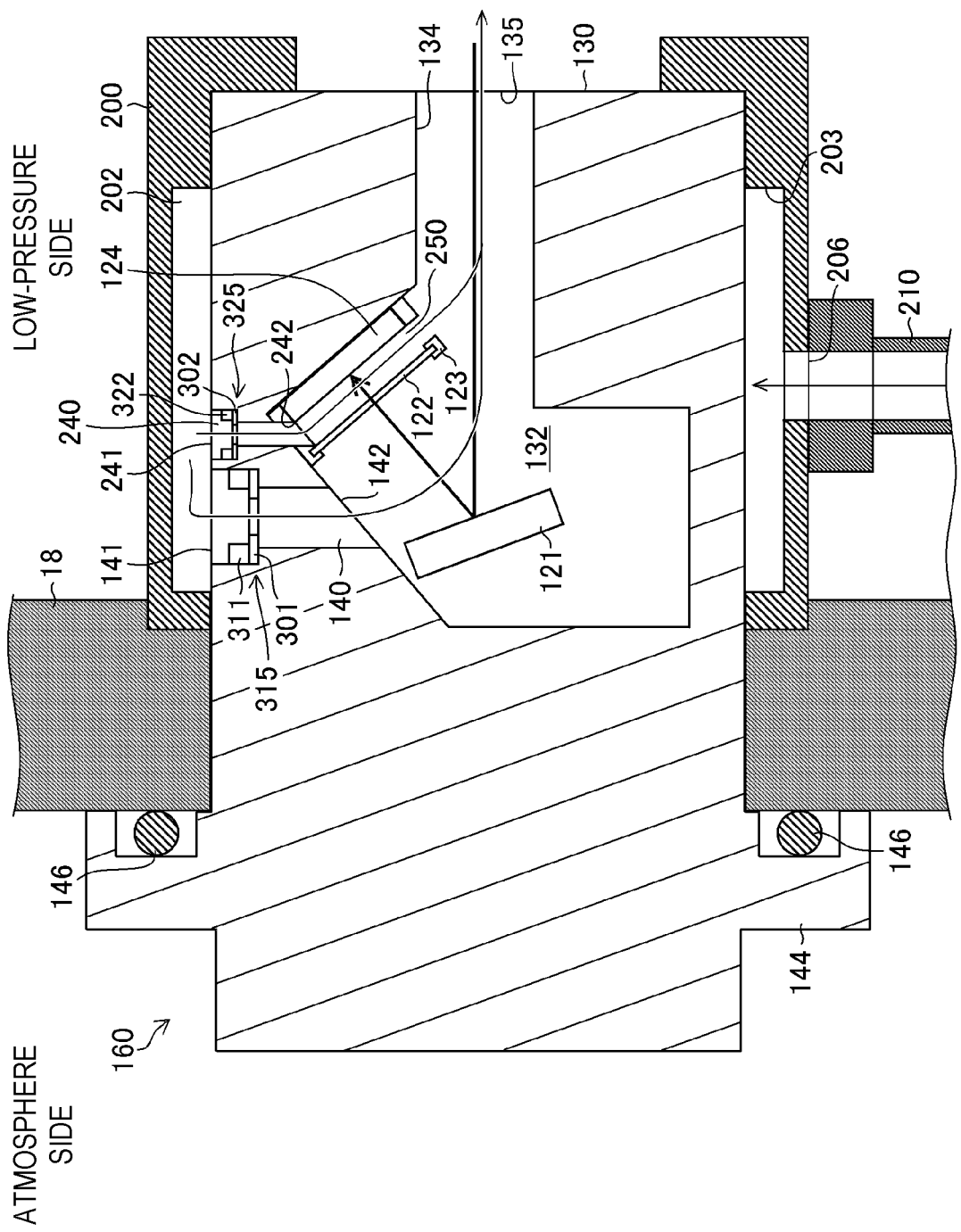
FIG. 11 is a cross-sectional view schematically illustrating the configuration of an EUV optical sensor unit according to Embodiment 4.

FIG. 11 is a cross-sectional view schematically illustrating the configuration of an EUV optical sensor unit according to Embodiment 4. The following describes any difference of Embodiment 4 illustrated in FIG. 11 from the configuration of Embodiment 1 described with reference to FIG. 3.

The EUV optical sensor unit 160 according to Embodiment 4 includes a first aperture 301 at the first gas supply part 140. The EUV optical sensor unit 160 also includes a second aperture 302 at the second gas supply part 240. In the example illustrated in FIG. 11, the first gas supply part 140 and the second gas supply part 240 are both provided with the apertures, but any one of the first gas supply part 140 and the second gas supply part 240 may be provided with an aperture.

The first aperture 301 is detachably fixed to the flow path of the first gas supply part 140 by a first aperture presser 311. The second aperture 302 is detachably fixed to the flow path of the second gas supply part 240 by a second aperture presser 322. The first gas supply part 140 includes a first aperture attachment part 315 having a support surface for attaching the first aperture 301.

The second gas supply part 240 includes a second aperture attachment part 325 having a support surface for attaching the second aperture 302.

7.2 Operation

The first aperture 301 adjusts the flow rate of gas flowing through the first gas supply part 140. The second aperture 302 adjusts the flow rate of gas flowing through the second gas supply part 240. A plurality of kinds of apertures may be combined to adjust the gas flow rate of each flow path. Each of the first aperture 301 and the second aperture 302 is an exemplary "aperture".

7.3 Effect

According to Embodiment 4, effects same as those of Embodiment 1 can be obtained. In addition, according to Embodiment 4, it is possible to perform adjustment to an appropriate purge condition even when the chamber internal pressure and the supply pressure of the gas supply device 61 are changed upon device upgrade or the like.

8. Modification

The above-described embodiments describe the examples in which gas (hydrogen gas) of the same kind is introduced to the first gas supply part 140 and the second gas supply part 240 by using the socket 200, but a path through which gas is introduced to the first gas supply part 140 and a path through which gas is introduced to the second gas supply part 240 may be provided independently from each other.

The kind of the purge gas supplied to the space 250 between the filter 122 and the second optical sensor 124 may be different from the kind of the purge gas supplied to the space between the EUV light reflection mirror 121 and the filter 122. For example, the purge gas supplied through the second gas supply part 240 is not limited to hydrogen gas but may be inert gas.

The above description is intended to provide not restriction but examples. Thus, the skilled person in the art would clearly understand that the embodiments of the present disclosure may be changed without departing from the scope of the claims.

The terms used throughout the specification and the appended claims should be interpreted as "non-limiting". For example, the term "comprising" or "comprised" should be interpreted as "not limited to what has been described as being comprised". The term "having" should be interpreted as "not limited to what has been described as having". It should be understood that the indefinite article "a" in the present specification and the claims means "at least one" or "one or more".

What is claimed is:

1. An extreme ultraviolet light sensor unit comprising:
a mirror configured to reflect extreme ultraviolet light;
a wavelength filter configured to selectively transmit the extreme ultraviolet light reflected by the mirror;
an optical sensor configured to detect the extreme ultraviolet light having transmitted through the wavelength filter;

a purge gas supply unit disposed to supply purge gas to a space between the wavelength filter and the optical sensor; and a spacer by which the wavelength filter and the optical sensor are separated from each other by a predetermined distance, wherein the purge gas is supplied from the purge gas supply unit to a gap formed at the space between the wavelength filter and the optical sensor by the spacer.

2. The extreme ultraviolet light sensor unit according to claim 1, wherein
the spacer includes a wall member that blocks a side surface of a flow path of the purge gas to reduce diffusion of the purge gas flowing through the gap between the wavelength filter and the optical sensor so that the purge gas flows in one direction.

3. The extreme ultraviolet light sensor unit according to claim 1, wherein
the purge gas supply unit includes a flow path structure in which the purge gas is not directly blown out toward each surface of the wavelength filter.

4. The extreme ultraviolet light sensor unit according to claim 1, wherein
the purge gas supply unit includes a gas flow-out port through which the purge gas flows out to a gap between the wavelength filter and the optical sensor, and
the gas flow-out port is provided at a position not facing the wavelength filter.

5. The extreme ultraviolet light sensor unit according to claim 1, wherein
the purge gas supply unit includes
a gas introduction port,
a first flow path part through which the purge gas is guided in a first direction from the gas introduction port, and
a second flow path part that is connected with the first flow path part and through which the purge gas is guided in a second direction intersecting the first direction,
the second direction is parallel to each surface of the wavelength filter, and
a direction of flow of the purge gas is bent at a part where the first flow path part and the second flow path part are connected with each other so that the purge gas is supplied to the space between the wavelength filter and the optical sensor in the second direction through the second flow path part.

6. The extreme ultraviolet light sensor unit according to claim 1, further comprising
a shield structure configured to prevent scattered light including visible light from being incident on the optical sensor from a gas flow path of the purge gas.

7. The extreme ultraviolet light sensor unit according to claim 1, further comprising
a third flow path part that is communicated with the space between the wavelength filter and the optical sensor and through which the purge gas having passed between the wavelength filter and the optical sensor is guided in a direction non-parallel to each surface of the wavelength filter.

8. An extreme ultraviolet light sensor unit comprising:
a mirror configured to reflect extreme ultraviolet light;
a wavelength filter configured to selectively transmit the extreme ultraviolet light reflected by the mirror;
an optical sensor configured to detect the extreme ultraviolet light having transmitted through the wavelength filter;

a purge gas supply unit disposed to supply purge gas to a space between the wavelength filter and the optical sensor;
a first purge gas supply unit disposed to supply first purge gas of a kind same as or different from the purge gas to a space between the mirror and the wavelength filter; and
a second purge gas supply unit as the purge gas supply unit disposed to supply second purge gas as the purge gas to the space between the wavelength filter and the optical sensor.

9. The extreme ultraviolet light sensor unit according to claim 1, further comprising
a purge gas ejection flow path that is communicated with the space between the wavelength filter and the optical sensor and through which the purge gas having passed between the wavelength filter and the optical sensor is guided to a gas exit at a position separated from the optical sensor, wherein
the purge gas ejection flow path includes a flow path structure in which a gas flow path from the space between the wavelength filter and the optical sensor to the gas exit is not straight.

10. The extreme ultraviolet light sensor unit according to claim 9, wherein
a pressure difference between both surfaces of the wavelength filter attributable to the first purge gas supplied to the space between the mirror and the wavelength filter through the first purge gas supply unit and the second purge gas supplied to the space between the wavelength filter and the optical sensor through the second purge gas supply unit is equal to or smaller than 3 kPa.

11. The extreme ultraviolet light sensor unit according to claim 9, wherein
a flow path cross-sectional area ratio of the first purge gas supply unit to the second purge gas supply unit is 5:1 to 15:1.

12. The extreme ultraviolet light sensor unit according to claim 9, wherein
a flow ratio of the first purge gas supply unit to the second purge gas supply unit is 8:1 to 12:1.

13. The extreme ultraviolet light sensor unit according to claim 9, wherein
at least one of the first purge gas supply unit and the second purge gas supply unit includes an aperture for adjusting a gas flow rate.

14. The extreme ultraviolet light sensor unit according to claim 13, wherein
at least one of the first purge gas supply unit and the second purge gas supply unit includes an aperture attachment part that detachably fixes the aperture.

15. An extreme ultraviolet light sensor unit comprising:
a mirror configured to reflect extreme ultraviolet light;
a wavelength filter configured to selectively transmit the extreme ultraviolet light reflected by the mirror;
an optical sensor configured to detect the extreme ultraviolet light having transmitted through the wavelength filter;
a purge gas supply unit disposed to supply purge gas to a space between the wavelength filter and the optical sensor; and
a pipe part through which plasma light including the extreme ultraviolet light to be incident on the mirror and the purge gas supplied from the purge gas supply unit pass, wherein the pipe part has an opening as a light entrance port of the plasma light, and the pipe part allows the plasma light incident through the opening to pass through toward the mirror and allows the purge gas having flowed between the mirror and the wavelength filter to flow out of the opening.

16. The extreme ultraviolet light sensor unit according to claim 15, further comprising
a case in which the mirror, the wavelength filter, and the optical sensor are housed, wherein the case is provided with the pipe part and the purge gas supply unit.

17. The extreme ultraviolet light sensor unit according to claim 16, further comprising a socket fitted outside the case, wherein
the socket includes
a gas path formation part forming a gap as a gas path between an outer wall of the case and an inner wall of the socket, and
a pipe connection part communicated with the gas path formation part,
the purge gas is supplied into the case through the gap formed between the outer wall of the case and the inner wall of the socket.

* * * * *